US009763328B1

(12) United States Patent
Zito et al.

(10) Patent No.: US 9,763,328 B1
(45) Date of Patent: Sep. 12, 2017

(54) ELECTROLYTIC CAPACITOR RETENTION DEVICE

(71) Applicant: Continental Automotive Systems, Inc., Auburn Hills, MI (US)

(72) Inventors: Donald J. Zito, Fox River Grove, IL (US); David Wayne Currier, McHenry, IL (US); Keith A Meny, Wheeling, IL (US); Leobardo Martinez Hernandez, Palatine, IL (US); Russ Dalbke, Fox River Grove, IL (US); Peter Lechowicz, West Dundee, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 0 days.

(21) Appl. No.: 15/067,439

(22) Filed: Mar. 11, 2016

(51) Int. Cl.
*H05K 1/11* (2006.01)
*H05K 1/18* (2006.01)
*H05K 3/30* (2006.01)
*H05K 3/32* (2006.01)
*H05K 3/34* (2006.01)
*H01G 9/008* (2006.01)
*H05K 5/03* (2006.01)
*H01G 9/06* (2006.01)
*H01G 9/08* (2006.01)

(52) U.S. Cl.
CPC ............ *H05K 1/181* (2013.01); *H01G 9/008* (2013.01); *H05K 1/11* (2013.01); *H05K 1/184* (2013.01); *H05K 3/30* (2013.01); *H05K 3/303* (2013.01); *H05K 3/32* (2013.01); *H05K 3/3421* (2013.01); *H05K 5/03* (2013.01); *H01G 9/06* (2013.01); *H01G 9/08* (2013.01); *H05K 1/183* (2013.01); *H05K 2201/10015* (2013.01)

(58) Field of Classification Search
CPC .......... H05K 1/181; H05K 3/303; H05K 5/03; H05K 1/11; H05K 2201/10015; H01G 9/008
See application file for complete search history.

(56) References Cited

U.S. PATENT DOCUMENTS 2,869,041 A * 1/1959 De Cola ................ H05K 1/119
257/727
5,873,899 A * 2/1999 Stutz, Jr. ................ A61N 1/375
607/36

(Continued)

*Primary Examiner* — Ishwarbhai B Patel

(57) ABSTRACT

A retention structure which provides both soldering and vibration stabilization of a capacitor as the capacitor is mounted to a printed circuit board (PCB) of an electronic module. An aperture is part of the PCB to stabilize and prevent the capacitor from rolling during manufacturing. Once secured to the PCB, Room Temperature Vulcanization (RTV), or similar adhesive bead, is placed onto a rigidizer or base plate (typically a casted or aluminum sheet plate). Once the capacitor is soldered in place and fixated on the PCB, the assembly is then placed onto the rigidizer such that the PCB is attached to the rigidizer using an adhesive, and the RTV bead contacts and is deformed by the capacitor, connecting the capacitor to the rigidizer to provide vibration stabilization support. The electronic module includes a cover, and optional dampening/constraint pads are attached to the cover of the electrolytic capacitor for additional vibration stabilization.

19 Claims, 4 Drawing Sheets

(56) References Cited

U.S. PATENT DOCUMENTS 5,999,412 A * 12/1999 Busse .................... H05K 1/183
361/761
8,300,419 B2 * 10/2012 Sugimoto ......... B29C 45/14065
174/260

* cited by examiner

ELECTROLYTIC CAPACITOR RETENTION DEVICE

FIELD OF THE INVENTION

The invention relates generally to an electronic module having a retention structure for securing a capacitor to a printed circuit board and a base plate.

BACKGROUND OF THE INVENTION

Electrolytic capacitors are typically used in motor control applications to achieve the high capacitance needed to prevent excessive supply voltage fluctuations when switching the output stages on and off. The electrolytic capacitor acts as a nearby charge reservoir, as opposed to the vehicle battery, which is connected via wire of substantial length. Axial capacitors (having one lead per end) have higher Ripple Currents ratings, thus improved performance over radial capacitors (having both leads on the same end) of the same size, due to a reduction in Equivalent Series Resistance. One issue with electrolytic capacitors is that they cannot be subjected to typical reflow solder oven temperatures, and hence need to be manually soldered via selective wave solder or other means. Another concern with electrolytic capacitors is maintaining the capacitor in place when the capacitor is exposed to vibration, shock, or other harsh physical environments.

Furthermore, axial capacitors are prone to roll or tip either prior to, or during the selective wave soldering process during manufacturing.

Accordingly, there exists a need for a retention structure which stabilizes the capacitor during the manufacturing process, as well as prevents the capacitor from rolling out of position during the manufacturing process.

SUMMARY OF THE INVENTION

The present invention is a retention structure which provides both soldering and vibration stabilization for an electrolytic capacitor mounted to a printed circuit board (PCB) of an electronic module, where the soldering and vibration stabilization of the capacitor is resistant to a harsh physical environment.

The present invention includes a cut-out, or aperture, in the PCB to stabilize the capacitor and prevent the capacitor from rolling during the manufacturing process. Once secured to the PCB, Room Temperature Vulcanization (RTV), or similar adhesive bead, is placed onto a rigidizer or base plate (typically a casted or aluminum sheet metal plate). The RTV offers supplemental fixation of the electrolytic capacitor when the capacitor is exposed to vibration and shock. Once the capacitor is soldered in place and fixated on the PCB, the assembly is then placed onto the rigidizer such that the RTV bead contacts and is deformed by the capacitor, connecting the capacitor to the rigidizer to provide vibration stabilization support.

The electronic module includes a cover, and in alternate embodiments, optional dampening/constraint pads are attached to the cover of the electrolytic capacitor for additional vibration stabilization.

It is an object of this invention to allow soldering of an electrolytic capacitor, and/or provide retention of the capacitor during shock and vibration.

In one embodiment, the present invention is an electronic module, which includes a capacitor, a first lead connected to a first end of the capacitor, a second lead connected to a second end of the capacitor, and a printed circuit board. The capacitor is connected to the printed circuit board with the first lead and the second lead. An aperture is formed as part of the printed circuit board, and the capacitor is attached to the printed circuit board such that at least a portion of the capacitor extends through the aperture.

The electronic module also includes a base plate, a cavity formed as part of the base plate, and an adhesive disposed in the cavity. The printed circuit board is attached to the base plate such that a portion of the capacitor extends into the cavity and contacts the adhesive, connecting the capacitor to the base plate.

The aperture is in substantial alignment with the cavity. The capacitor, printed circuit board, and the base plate vibrate at substantially the same frequency. A first edge is formed as part of the aperture, and a second edge formed as part of the aperture. The width of the capacitor is greater than the width of the aperture, such that the capacitor is in contact with the first edge and the second edge when the capacitor is connected to the printed circuit board.

In one embodiment, the electronic module includes a cover, and a constraint pad connected to the cover. The constraint pad contacts the capacitor when the cover is connected to the base plate, and the constraint pad applies force to the capacitor to support the capacitor.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
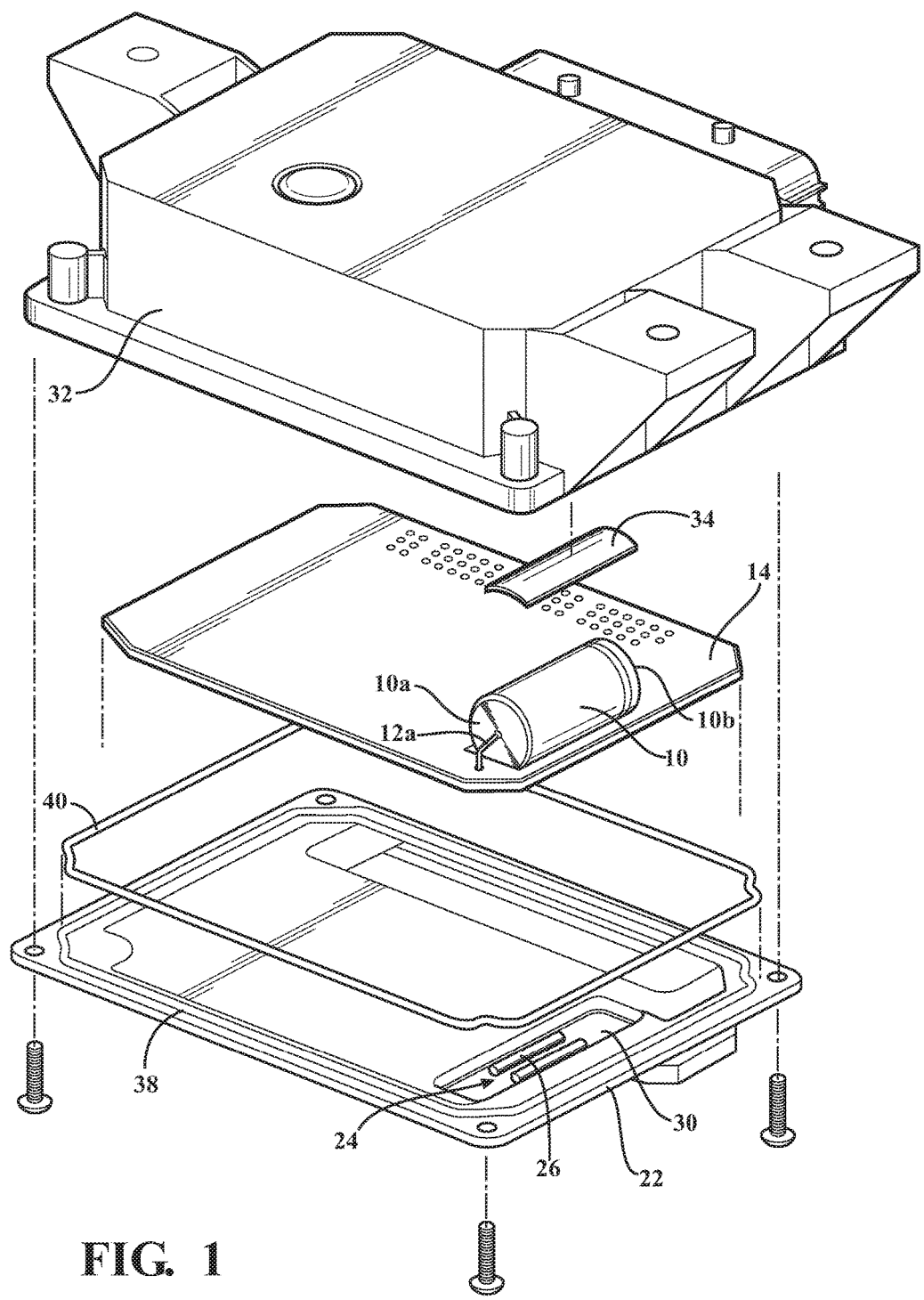
FIG. 1 is an exploded view an electronic module having a capacitor connected to a printed circuit board, according to embodiments of the present invention.
Figure 2:
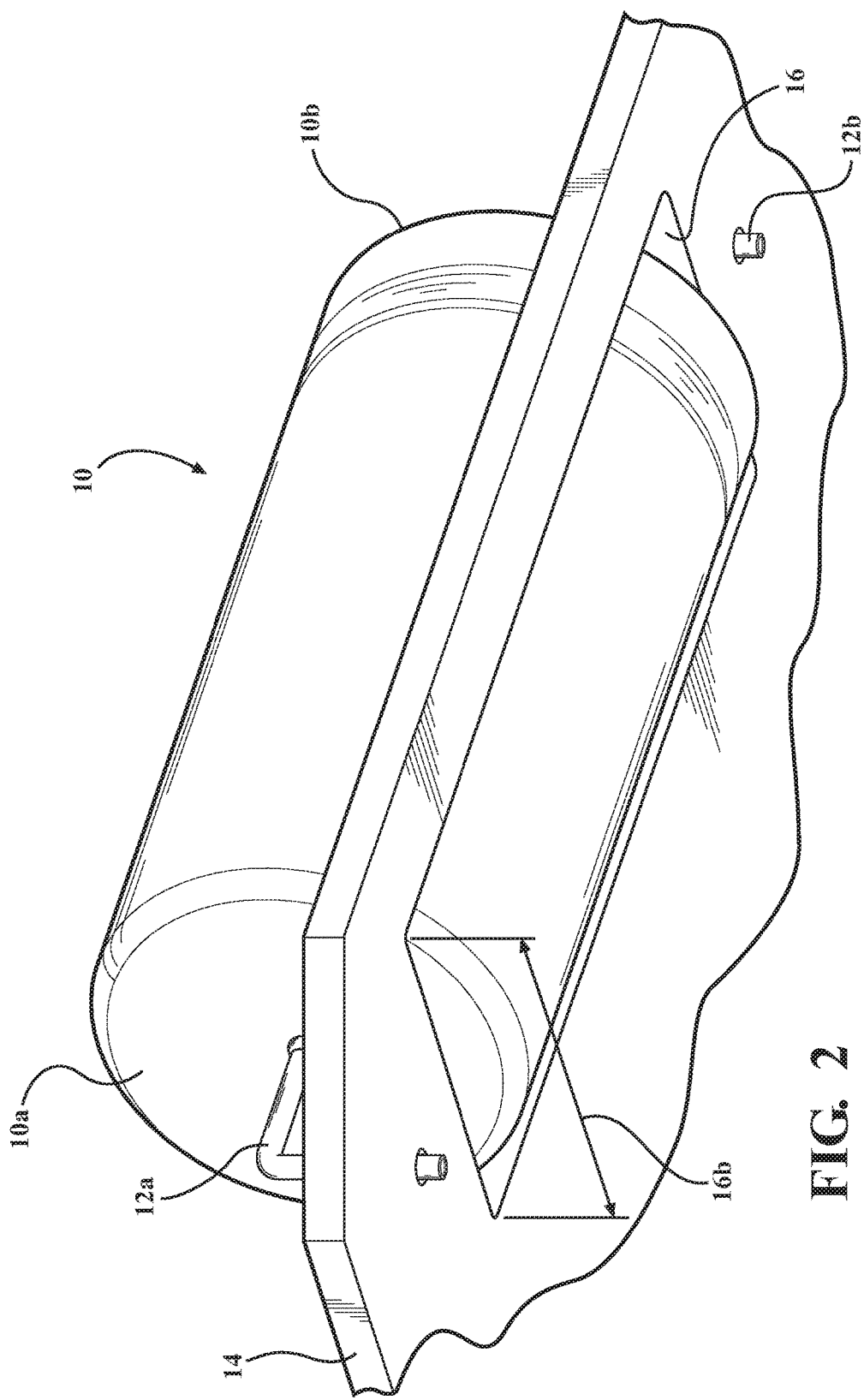
FIG. 2 is a perspective view of a capacitor connected to a printed circuit board which is part of an electronic module, according to embodiments of the present invention.
Figure 3:
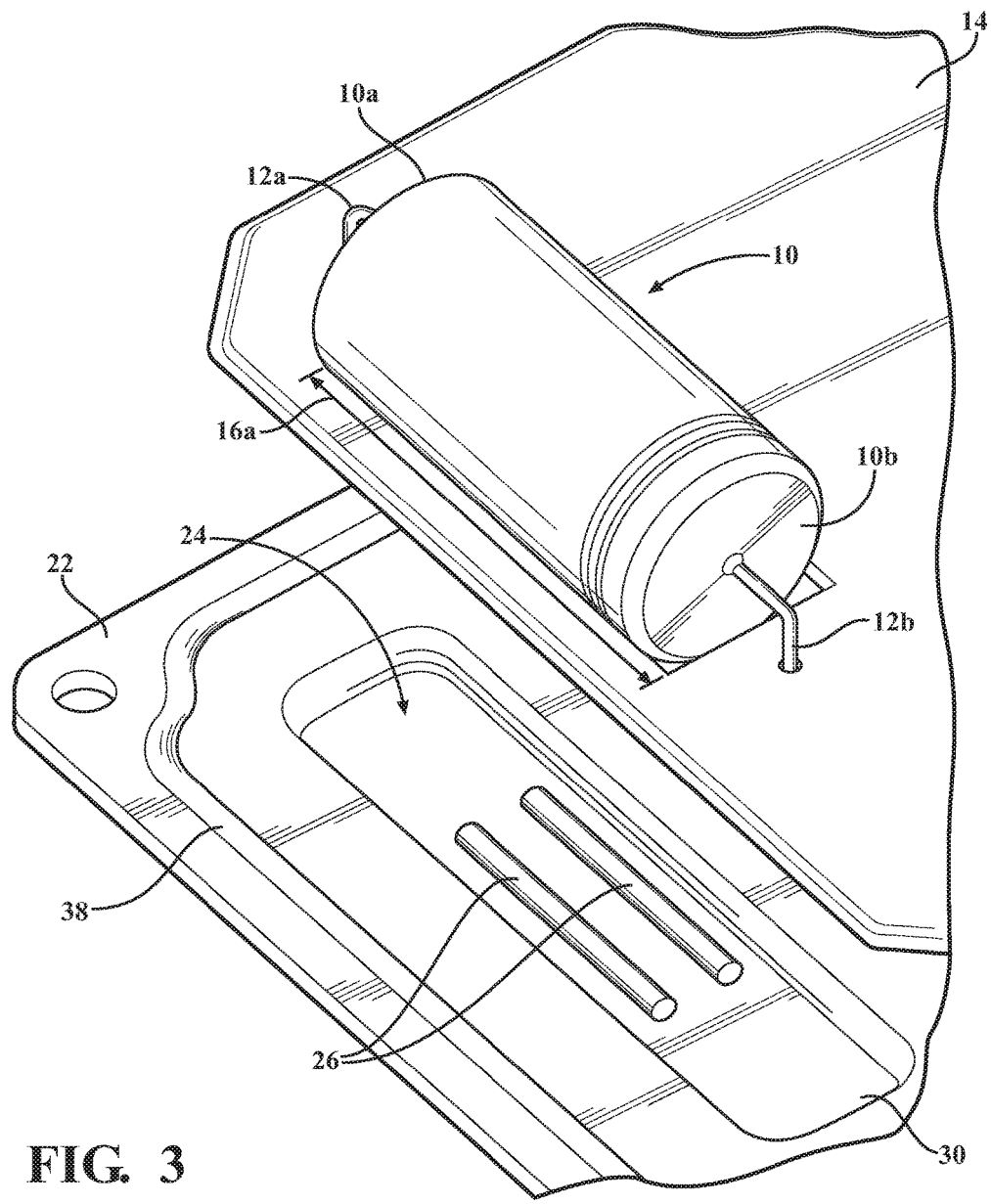
FIG. 3 is an exploded view of a portion of an electronic module having a capacitor attached to a printed circuit board, according to embodiments of the present invention.

The following description of the preferred embodiment(s) is merely exemplary in nature and is in no way intended to limit the invention, its application, or uses.

A capacitor attached to a printed circuit board (PCB) with a retention structure according to the present invention is shown in the Figures generally at 10. The capacitor 10 in this embodiment is an electrolytic capacitor 10, but it is within the scope of the invention that other types of capacitors may be used. The capacitor 10 in this embodiment is an axial capacitor 10, having two leads 12a,12b, where a first lead 12a is located on a first end 10a of the capacitor 10, and a second lead 12b is located on a second end 10b of the capacitor 10. Each of the leads 12a,12b is attached to the PCB 14 through the use of soldering or welding. The PCB 14 includes an aperture 16, or cut-out, where the aperture 16 has a length 16a that is at least equal to or greater than the length of the capacitor 10, and a width 16b that is less than the width of the capacitor 10. The width 16b of the aperture 16 is less than the width of the capacitor 10 to properly locate the capacitor 10 relative to the PCB 14 during assembly, and to ensure that the capacitor 10 is unable to move through the aperture 16.

When disposed in the aperture 16, the capacitor 10 is supported and in contact with a first edge 18 of the aperture 16, and a second edge 20 of the aperture 16. The capacitor 10 being in contact with each edge 18,20 of the aperture 16 prevents the capacitor 10 from rolling or tipping during the soldering process as the leads 12a,12b are soldered to the PCB 14. Also included is a base plate 22, and formed as part of the base plate 22 is a cavity, shown generally at 24. The base plate 22 is part of a housing, and the housing is part of an electronic module. During assembly, there are adhesive beads 26 placed on a bottom surface 30 of the cavity 24. There are two adhesive beads 26 shown in the Figures, however, it is within the scope of the invention that more or less beads 26 may be used, and may be placed in different configurations, such as an array, or the like. The beads 26 in this embodiment are made of a Room Temperature Vulcanization (RTV) adhesive, but it is within the scope of the invention that other types of adhesives may be used as well, such as, but not limited to, thermally conductive adhesive (TCA).

Figure 4:
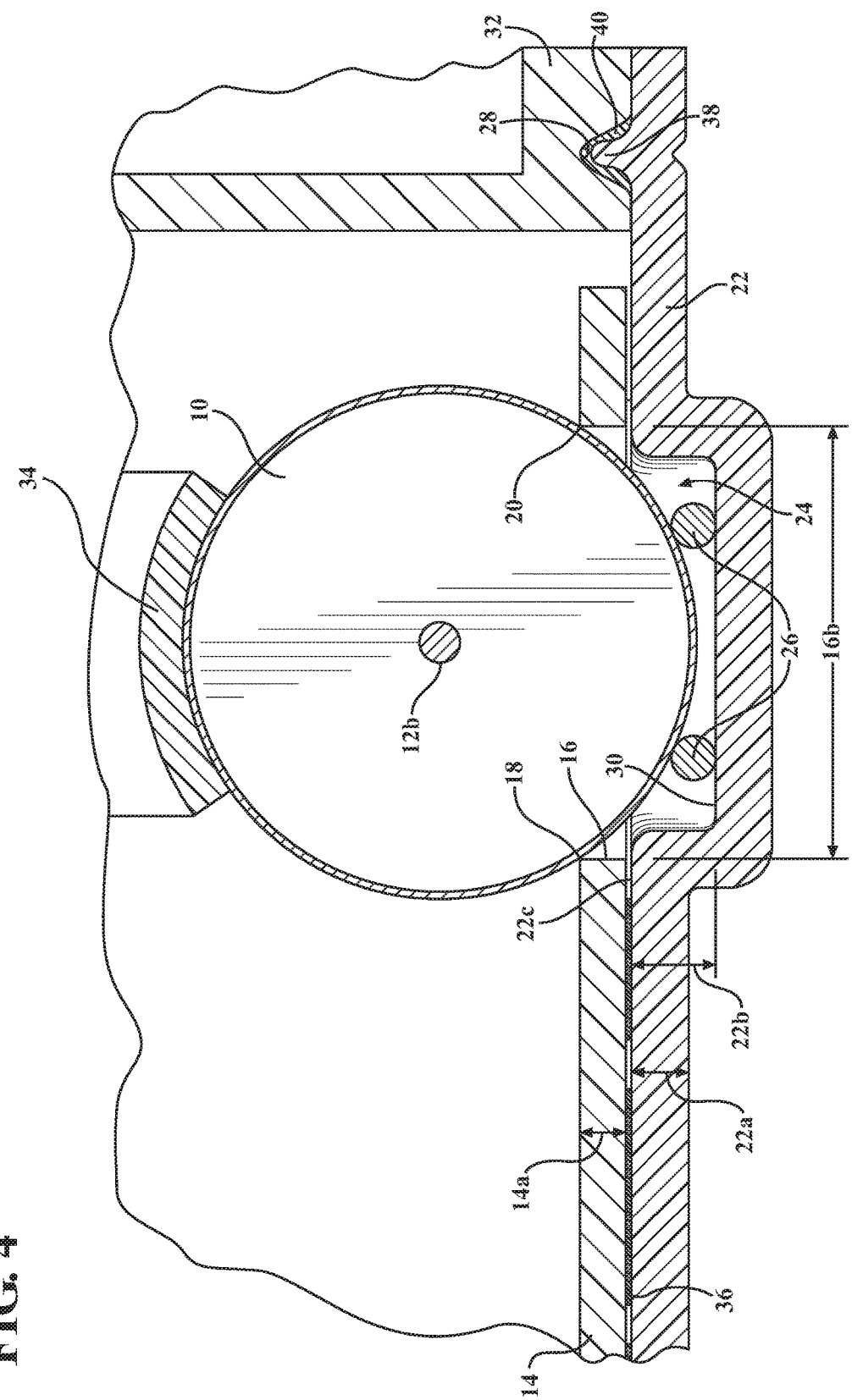
FIG. 4 is a sectional view of a portion of an electronic module having a capacitor attached to a printed circuit board, according to embodiments of the present invention.

After the capacitor 10 is attached to the PCB 14, and the beads 26 are placed on the bottom surface 30 of the cavity 24, the PCB 14 is attached to the base plate 22 through the use of an adhesive 36, shown in FIG. 4, such as Pressure Sensitive Adhesive (PSA), TCA, or the like. The PCB 14 is attached to the base plate 22 in such a way that the portion of the capacitor 10 that extends through the aperture 16 also extends into the cavity 24 and contacts each of the beads 26 such that the beads 26 deform, and connect the capacitor 10 to the base plate 22.

The PCB 14 has a thickness 14a, the base plate 22 has a thickness 22a, and the cavity 24 has a depth 22b relative to the top surface 22c of the base plate 22. In addition to the width 16b of the aperture 16, the thickness 14a of the PCB 14, the thickness 22a of the base plate 22, the thickness of the adhesive 36, and the depth 22b of the cavity 24 may all be configured in any desired manner to ensure that the capacitor 10 is positioned correctly, such that the capacitor 10 contacts the beads 26, to connect the capacitor 10 to the base plate 22 using the adhesive beads 26 in the cavity 24.

The connection between the PCB 14 and the capacitor 10, the connection between the PCB 14 and the base plate 22, and the connection between the capacitor 10 and the base plate 22 ensures that the PCB 14, base plate 22, and capacitor 10 all vibrate at the same frequency when the electronic module is exposed to high-vibration environments.

The electronic module also includes a cover 32 having a groove 28, and the base plate 22 also includes a rib 38. Once the PCB 14 is attached to the base plate 22, the cover 32 is also attached to the base plate 22 using an adhesive 40. During assembly, the adhesive 40 is disposed in the groove 28, and the cover 32 is attached to the base plate 22 such that the rib 38 extends into the groove 28 and contacts the adhesive 40 in the groove 28. The adhesive 40 is cured to attach the cover 32 to the base plate 22.

In an alternate embodiment, attached to the inside of the cover 32 is a constraint pad 34, where the constraint pad 34 is in contact with the capacitor 10 when the cover 32 is attached to the base plate 22. The constraint pad 34 is not connected to the capacitor 10, and is able to move relative to the capacitor 10 if the frequency of vibration of the cover 32 is different than the frequency of vibration of the capacitor 10. The cover 32 includes a wiring harness (not shown), which may be exposed to different vibration frequencies than the base plate 22, PCB 14, and capacitor 10.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. An apparatus, comprising:
    an electronic module, including:
        a capacitor;
        at least one lead connected to the capacitor;
        a printed circuit board, the capacitor connected to the printed circuit board with the at least one lead;
        an aperture formed as part of the printed circuit board such that when capacitor is attached to the printed circuit board, at least a portion of the capacitor extends through the aperture;
        a base plate; and
        an adhesive disposed on the base plate;
        a cavity formed as part of the base plate, wherein the adhesive is disposed in the cavity;
    wherein the capacitor contacts the adhesive when the printed circuit board is attached to the base plate such that the adhesive connects the capacitor to the base plate and a portion of the capacitor extends into the cavity when the printed circuit board is connected to the base plate, such that the adhesive connects the capacitor to the base plate.

2. The apparatus of claim 1, wherein the at least one lead further comprises:
    a first lead connected to a first end of the capacitor; and
    a second lead connected to a second end of the capacitor, the first lead and the second lead are connected to the printed circuit board.

3. The apparatus of claim 1, wherein the capacitor, printed circuit board, and the base plate vibrate at substantially the same frequency.

4. The apparatus of claim 1, wherein a width of the capacitor is greater than a width of the aperture.

5. The apparatus of claim 1, further comprising: a cover; and a constraint pad connected to the cover; wherein the constraint pad contacts the capacitor when the cover is connected to the base plate, and the constraint pad applies force to the capacitor to support the capacitor.

6. The apparatus of claim 1, further comprising:
    a second adhesive disposed between the printed circuit board and the base plate;
    wherein the printed circuit board is attached to the base plate using the second adhesive.

7. An electronic module having a retention structure for attaching a capacitor to a printed circuit board and a base plate, the electronic module comprising:
    a capacitor having a first end and a second end;
    a first lead connected to the first end of the capacitor;
    a second lead connected to the second end of the capacitor;

a printed circuit board, the capacitor connected to the printed circuit board with the first lead and the second lead;

an aperture formed as part of the printed circuit board, the capacitor being attached to the printed circuit board such that at least a portion of the capacitor extends through the aperture;

a base plate;

a cavity formed as part of the base plate; and an adhesive disposed in the cavity;

wherein the printed circuit board is attached to the base plate such that a portion of the capacitor extends into the cavity and contacts the adhesive, connecting the capacitor to the base plate.

8. The electronic module of claim 7, wherein the aperture is in substantial alignment with the cavity.

9. The electronic module of claim 7, wherein the capacitor, printed circuit board, and the base plate vibrate at substantially the same frequency.

10. The electronic module of claim 7, further comprising:
a first edge formed as part of the aperture; and
a second edge formed as part of the aperture;
wherein a width of the capacitor is greater than a width of the aperture, and the capacitor is in contact with the first edge and the second edge when the capacitor is connected to the printed circuit board.

11. The electronic module of claim 7, further comprising: a cover; and a constraint pad connected to the cover; wherein the constraint pad contacts the capacitor when the cover is connected to the base plate, and the constraint pad applies force to the capacitor to support the capacitor.

12. The electronic module of claim 7, further comprising:
a second adhesive disposed between the printed circuit board and the base plate;
wherein the printed circuit board is attached to the base plate using the second adhesive.

13. A method for mounting a capacitor in an electronic module according claim 7, comprising the steps of:
providing a capacitor;
providing a printed circuit board;
providing at least one lead;
providing an aperture formed as part of the printed circuit board;
providing a base plate; and
providing an adhesive;
placing the adhesive on the base plate;
connecting the capacitor to the printed circuit board using the at least one lead, such that at least a portion of the capacitor extends through the aperture;
connecting the printed circuit board to the base plate such that the capacitor contacts the adhesive, and the adhesive connects the capacitor to the base plate.

14. The method for mounting a capacitor in an electronic module of claim 13, further comprising the steps of: providing a first lead, the at least one lead including the first lead; and providing a second lead, the at least one lead including the second lead; connecting the capacitor to the printed circuit board using the first lead and the second lead.

15. The method for mounting a capacitor in an electronic module of claim 13, further comprising the steps of: providing a cavity formed as part of the base plate; placing the adhesive in the cavity such that when the printed circuit board is connected to the base plate, the aperture is positioned such that at least a portion of the capacitor extends into the cavity.

16. The method for mounting a capacitor in an electronic module of claim 13, further comprising the steps of providing the capacitor, the printed circuit board, and the base plate to vibrate at substantially the same frequency.

17. The method for mounting a capacitor in an electronic module of claim 13, further comprising the steps of providing the width of the capacitor to be greater than the width of the aperture.

18. The method for mounting a capacitor in an electronic module of claim 13, further comprising the steps of: providing a cover; and
providing a constraint pad connected to the cover;
connecting the cover to the base plate such that constraint pad contacts and applies force to the capacitor, and the constraint pad supports the capacitor.

19. The method for mounting a capacitor in an electronic module of claim 13, further comprising the steps of: providing a second adhesive disposed between the printed circuit board and the base plate; connecting the printed circuit board to the base plate using the second adhesive.

* * * * *